United States Patent [19]

Nakano et al.

[11] 4,368,300

[45] Jan. 11, 1983

[54] PHOTOSETTING COMPOSITION CONTAINING MODIFIED EPOXY RESINS AND AN OLIGOESTER DIACRYLATE COMPOUND

[75] Inventors: Tsunetomo Nakano; Kazuaki Nishio; Hiroshi Watanabe; Hiroshi Yasuno, all of Ichihara, Japan

[73] Assignee: Ube Industries, Ltd., Yamaguchi, Japan

[21] Appl. No.: 326,841

[22] Filed: Dec. 3, 1981

[30] Foreign Application Priority Data

Dec. 12, 1980 [JP] Japan ................................. 55-174509

[51] Int. Cl.³ .............................................. C08L 63/00
[52] U.S. Cl. .................................... 525/531; 525/922; 204/159.15; 204/159.19; 204/159.23
[58] Field of Search ............................... 525/531, 922; 204/159.15, 159.19, 159.23

[56] References Cited

U.S. PATENT DOCUMENTS

| | | | |
|---|---|---|---|
| 3,256,226 | 6/1966 | Fekete | 525/531 |
| 3,301,743 | 1/1967 | Fekete | 525/531 |
| 3,793,398 | 2/1974 | Hokamura | 525/531 |
| 3,808,114 | 4/1974 | Tsvchihama | 525/531 |
| 3,882,187 | 5/1975 | Takiyama | 525/531 |
| 3,968,016 | 7/1976 | Wismen | 525/531 |
| 4,014,771 | 3/1977 | Rosenkranz | 525/531 |
| 4,100,045 | 7/1978 | Bogan | 525/531 |

FOREIGN PATENT DOCUMENTS

| | | |
|---|---|---|
| 50-46791 | 6/1973 | Japan . |
| 55-54315 | 10/1978 | Japan . |
| 56-41220 | 9/1979 | Japan . |

*Primary Examiner*—Paul Lieberman
*Attorney, Agent, or Firm*—Burgess, Ryan and Wayne

[57] ABSTRACT

A photosetting composition comprises an unsaturated acid-modified bisphenol type epoxy compound having an acryloyl radical; an oligoester diacrylate compound having a molecular weight of 420 or more; a photopolymerizable acrylate type monomeric compound having a molecular weight of 100 to 400; a bisphenol type epoxy resin having a softening point of 50° C. to 150° C. or a saturated acid-modified bisphenol type epoxy resin having a softening point of 50° C. to 150° C.; and a photopolymerization initiator, said composition having a proper viscosity and an excellent photocuring reaction rate and being able to form a photocured resinous film or article having a satisfactory Dupont impact strength, impact bending strength, and bonding property to metallic materials.

26 Claims, No Drawings

PHOTOSETTING COMPOSITION CONTAINING MODIFIED EPOXY RESINS AND AN OLIGOESTER DIACRYLATE COMPOUND

FIELD OF THE INVENTION

The present invention relates to a photosetting polymeric composition, more particularly, to a photosetting composition containing modified epoxy resins, and an oligoester diacrylate compound.

BACKGROUND OF THE INVENTION

Japanese patent application Laid-Open No. 50-46791 discloses a photosetting composition comprising, as photosetting base polymers, a modified epoxy resin which is an esterification reaction product of an epoxy resin with acrylic or methacrylic acid and an oligoester diacrylate which is a coesterification reaction product of a polycarboxylic acid with a polyhydric alcohol compound and acrylic or methacrylic acid.

The above-mentioned type of photosetting composition is useful as a solvent-free type photosetting composition. However, the above-mentioned photosetting composition is disadvantageous in the following points.

That is, when the composition is photoset in ambient air by applying ultraviolet rays thereto, the rate of the photocuring reaction, which is represented by the so-called belt speed, is not satisfactorily high. Also, when a film of the photosetting composition formed on a tin-plated steel sheet or when an aluminium sheet is photocured by means of ultraviolet rays, the resultant photoset film exhibits poor bonding activity to the tin-plated steel sheet or aluminium sheet, poor impact strength, and poor impact bending strength. The photosetting composition therefore, cannot be practically used for industrially coating cans.

Japanese patent application Laid-Open No. 55-54315 (1980) discloses a photosetting composition which can produce a photoset resinous product having excellent heat-resistance and satisfactory flexibility. This type of photosetting composition contains, as photosetting base polymers, a modified epoxy resin which is a reaction product of an epoxy resin with acrylic or methacrylic acid and a thermosetting modified epoxy resin which is a reaction product of an epoxy resin with a thermosetting phenol-formaldehyde resin.

However, in the above-mentioned type of photosetting composition, the compatibility of the modified epoxy resin with the thermosetting modified epoxy resin is unsatisfactory. The photosetting composition is therefore, sometimes devitrified and becomes useless for practical uses. Also, when a film of the photosetting composition is photocured, the resultant film exhibits unsatisfactory impact bending strength. The photosetting composition is therefore, useless for coating cans.

Japanese patent application Laid-Open No. 56-41220 (1981) discloses a photosetting composition having a satisfactory photocuring reaction rate and bonding property and being capable of being converted to a photocured polymeric article having excellent impact strength. This composition comprises, as photosetting base polymers, a modified epoxy resin which is a reaction product of a liquid epoxy resin with a partial ester compound of an aromatic poly-carboxylic acid; and an oligoester diacrylate or dimethacrylate which is a reaction product of acrylic or methacrylic acid with an oligoester of an aromatic polycarboxylic acid with a polyhydric alcohol compound. This type of photosetting composition, however, is unsatisfactory in the poor impact bending strength of a photoset film of the composition.

SUMMARY OF THE INVENTION

An object of the present invention is to provide a photosetting composition which exhibits a satisfactory photocuring reaction rate.

Another object of the present invention is to provide a photosetting composition which is capable of being converted to a photoset polymeric article or coating film having satisfactory impact strength and impact bending strength.

Still another object of the present invention is to provide a photosetting composition which can be converted to a transparent photoset article or coating film.

The other object of the present invention is to provide a photosetting composition which has an excellent bonding property to various metal articles.

The above-mentioned objects can be attained by the photosetting composition of the present invention, which comprises:

A. 100 parts by weight of a first epoxy component comprising at least one unsaturated acid-modified epoxy compound which has been prepared by the modification reaction of a bisphenol type epoxy resin with an unsaturated acid compound having at least one acryloyl radical;

B. 30 to 400 parts by weight of an oligoester component comprising at least one oligoester diacrylate compound which has been prepared by the reaction of acrylic acid with an oligoester of an aromatic polycarboxylic acid with an organic dihydroxyl compound and which has a molecular weight of 420 or more and is in the form of a liquid at room temperature;

C. 50 to 1200 parts by weight of a photopolymerizable monomeric component comprising at least one photopolymerizable acrylate type monomeric compound having a molecular weight of 100 to 400 and being in the form of a liquid at room temperature;

D. 5 to 400 parts by weight of a second epoxy component comprising at least one epoxy compound selected from the group consisting of (1) bisphenol type epoxy resins having a softening point of from 50° C. to 150° C. and (2) saturated carboxylic acid-modified epoxy compounds which have been prepared by the modification reaction of bisphenol type epoxy resins with saturated hydrocarbon carboxylic acids and which have a softening point of from 50° C. to 150° C., and;

E. a photopolymerization initiator in an amount of 0.5% to 15% based on the entire weight of the photosetting composition.

DETAILED DESCRIPTION OF THE INVENTION

The photosetting composition of the present invention comprises 100 parts by weight of a first epoxy component (A), 30 to 400 parts by weight of an oligoester component (B), 50 to 1200 parts by weight of a photopolymerizable monomeric component (C), 5 to 400 parts by weight of a second epoxy component (D), and 0.5% to 15% of a photopolymerization initiator (E) based on the entire weight of the photosetting composition.

The first epoxy component (A) comprises at least one unsaturated acid-modified epoxy compound which has been prepared by ring-opening and esterifying a bisphenol type epoxy resin with an unsaturated organic acid compound having at least one acryloyl radical (—CO—CH=CH$_2$). The unsaturated acid-modified epoxy compound has epoxy rings and unsaturated radicals.

In the unsaturated acid-modified epoxy compound, it is preferable that the degree of esterification of the epoxy rings in the bisphenol type epoxy resin molecules with the unsaturated acid compound is in the range of from 30% to 80%, more preferably, from 35% to 75%, based on the entire number of the epoxy rings.

The bisphenol type epoxy resins are in the form of a liquid or solid and may be selected from the reaction products of epichlorohydrin with bisphenol compounds, for example, 2,2-bis (4'-hydroxyphenyl) propane or bis (4'-hydroxyphenyl) methane. The bisphenol type epoxy resins preferably have a molecular weight in the range of from 380 to 2000, more preferably, from 500 to 1800, still more preferably, 600 to 1500, and an epoxy equivalent in the range of from 180 to 2000, more preferably, from 190 to 1500, still more preferably, from 300 to 1000.

The unsaturated organic acid compound usable for preparing the first epoxy component (A) can be selected from the group consisting of acrylic acid, partial esterification products of organic polycarboxylic acids with acrylate compounds having at least one hydroxyl radical, and mono- and di-esterification products of acrylate compounds having at least one hydroxyl radical with phosphoric acid.

The molecules of the partial esterification products of the organic polycarboxylic acids with the acrylate compounds are preferably each provided with at least one carboxylic radical and at least one acryloyl radical and have a molecular weight of 1000 or less, more preferably, 800 or less, still more preferably, from 200 to 500.

The organic polycarboxylic acid usable for preparing the partial esterification products, can be selected from the group consisting of aromatic polycarboxylic acids, for example, o-, m-, and p-phthalic acids, trimellitic acid pyromellitic acid, biphenyltetracarboxylic acids, and benzophenone tetracarboxylic acids; aliphatic unsaturated polycarboxylic acids, for example, citric acid and maleic acid, and; acid anhydride of the above-mentioned acids.

The hydroxyl radical-containing acrylate compounds usable for the partial esterification products of the polycarboxylic acids and for the mono- and di-esterification products of phosphoric acid can be selected from the group consisting of 2-hydroxyethylacrylate, 2-hydroxypropylacrylate, diethylene glycol monoacrylate, dipropylene glycol monoacrylate, and triethylene glycol monoacrylate.

In the first epoxy component (A), the molecule of the unsaturated acid-modified epoxy compound has the epoxy rings remained in the bisphenol type epoxy resin moiety and functional groups each having at least one acryloyl radical, introduced by the unsaturated acid compound moieties. If the content of the functional groups introduced by the unsaturated acid compound in the unsaturated acid-modified epoxy compound is small, the resultant first epoxy component causes the resultant photosetting composition to exhibit unsatisfactory photosetting reaction velocity. The content of the functional group depends on the degree of esterification of the epoxy resin with the unsaturated acid compound. That is, the degree of the esterification is preferably in the range of from 30% to 80%. When the degree of esterification is less than 30%, the resultant photosetting composition may sometimes exhibit unsatisfactory photocuring reaction rate. However, it is difficult to produce an unsaturated acid-modified epoxy compound having a degree of esterification more than 80%. That is, by adjusting the degree of esterification to 30% to 80%, the resultant photosetting composition can exhibit a satisfactory photocuring reaction rate.

The photosetting composition of the present invention contains 30 to 400 parts by weight of an oligoester component (B) which comprises at least one oligoester diacrylate compound per 100 parts by weight of the first epoxy component (A). This compound is prepared by the diesterification reaction of an oligoester with acrylic acid. The oligoester can be prepared by the condensation polymerization of an aromatic polycarboxylic acid, for example, an aromatic dicarboxylic acid with a dihydroxy organic compound, for example, dihydroxyl alkyl compounds or polyalkylene glycol such as polyethylene glycol or polypropylene glycol, and by isolating the resulting oligoester from nonreacted compounds and by-products in the reaction mixture.

The aromatic polycarboxylic acid may be selected from o-, m- and p-phthalic acids, phthalic anhydride, trimellitic acid, trimellitic anhydride and 4,4'-biphenyl dicarboxylic acid.

The dihydroxy alkyl compound may be selected from the group consisting of n-butane diol, n-pentane diol, n-hexane diol, n-heptane diol, and n-octane diol. More preferable the dihydroxy alkyl compound is n-pentane diol or n-hexane diol.

The polyethylene glycol compound which is of the formula, HO—(C$_2$H$_5$O)$_p$H, wherein p represents an integer of, preferably, 2 to 5, more preferably, 2 to 4, may be selected from diethylene glycol, triethylene glycol, and tetraethylene glycol. The most preferable polyethylene glycol compounds are diethylene glycol or triethylene glycol.

The oligoester diacrylate compound is preferably selected from those of the formulae (I) and (II):

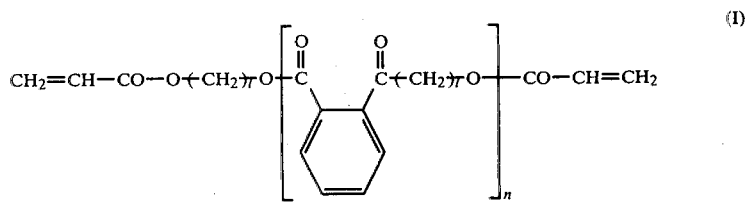

(I)

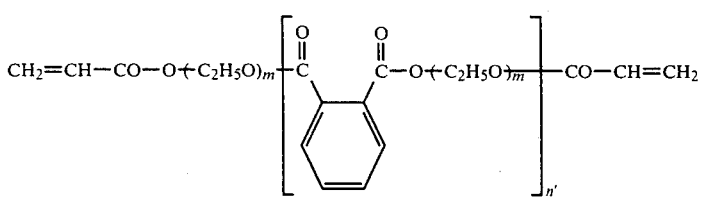

wherein l represents an integer of 4 to 8, m represents an integer of 2 to 5, and n and n' represent an integer of 1 to 10.

It is preferable that the oligoester diacrylate compounds usable for the present invention have a molecular weight of 420 or more, more preferably, 425 to 20,000 and a rotation viscosity (at 25° C.) of from 200 to 50,000 centipoises, more preferably, from 300 to 20,000 centipoises, and are in the form of transparent liquids at room temperature.

In the photosetting composition of the present invention, it is indispensable that the amount of the oligoester component (B) is in the range of from 30 to 400 parts by weight, preferably, from 40 to 350 parts by weight, per 100 parts by weight of the first epoxy component (A). When the amount of the oligoester component (B) is less than 30 parts by weight, the resultant photoset film or article from the photosetting composition exhibits unsatisfactory impact strength and impact bending strength. Also, when the amount of the oligoester component (B) is more than 400 parts by weight, the resultant photosetting composition exhibits an excessively large rotation viscosity and, therefore, is not convenient for handling.

The photosetting composition of the present invention contains 50 to 1200 parts by weight of a photopolymerizable monomeric component (C) per 100 parts by weight of the first epoxy component (A). The component (C) comprises at least one photopolymerizable acrylate type monomeric compound having a molecular weight of 100 to 400, preferably, 110 to 380, and being in the form of a liquid at room temperature. The acrylate compound can be selected from the group consisting of hydroxyalkylacrylate compounds, glycol diacrylate compounds, ester compounds of polyhydric alcohol compounds with acrylic acid, ester compounds of polycarboxylic acids with hydroxyalkylacrylates, ester compounds of phosphoric acid with hydroxyalkylacrylates, and phenol type acrylate compounds.

The hydroxyalkylacrylate compound may be selected from the group consisting of 2-hydroxyethylacrylate, 2-hydroxypropylacrylate, diethyleneglycol monoacrylate, dipropyleneglycol monoacrylate and triethyleneglycol monoacrylate.

The glycoldiacrylate compound may be selected from the group consisting of ethyleneglycol diacrylate, propyleneglycol diacrylate, diethyleneglycol diacrylate, dipropyleneglycol diacrylate, and triethyleneglycol diacrylate.

The ester compound of a polyhydric alcohol compound with acrylic acid may be selected from the group consisting of pentaerithritol triacrylate, pentaerithritol diacrylate, glycerine monoacrylate, and glycerine diacrylate.

In the ester compounds of polycarboxylic acids with the hydroxyalkylacrylates, the polycarboxylic acids can be selected from the group consisting of o-, m-, and p-phthalic acids, trimellitic acid, pyromellitic acid, biphenyl tetracarboxylic acids, benzophenone tetracarboxylic acids, citric acids, and maleic acids, and the hydroxyalkylacrylates can be selected from the group consisting of 2-hydroxyethylacrylate and 2-hydroxypropylacrylate. Also, in the ester compounds of phosphoric acid with hydroxyalkylacrylates, the hydroxyalkylacrylates can be selected from the group consisting of 2-hydroxyethylacrylate and 2-hydroxypropylacrylate.

Furthermore, the phenol type acrylate compounds may be selected from the group consisting of phenoxyethylacrylate, phenoxymethylacrylate, 2-phenoxy-1-methyl-ethylacrylate, and 3-phenoxy-2-hydroxypropylacrylate.

In the photosetting composition of the present invention, the amount of the photopolymerizable monomeric component (C) is in the range of from 50 to 1200 parts by weight, preferably, from 100 to 1000 parts by weight, per 100 parts by weight of the first epoxy component (A). When the amount of the component (C) is less than 50 parts by weight, the resultant composition exhibit an excessively large rotation viscosity. Also, if the amount of the component (C) is more than 1200 parts by weight, the resultant composition exhibit a poor impact bending strength.

In the photosetting composition of the present invention, the photopolymerizable monomeric component (C) may contain, in addition to the photopolymerizable acrylate type compound, at least one additional photopolymerizable unsaturated monomeric compound which has a molecular weight of 70 to 400 and which is in the form of a liquid at room temperature. The additional compound can be selected from the group consisting of hydroxyalkylmethacrylate, ester compounds of polycarboxylic acids with hydroxyalkylmethacrylates, ester compounds of phosphoric acid with hydroxyalkylmethacrylate, glycol dimethacrylate, styrene, vinyl toluene, vinyl acetate, methylmethacrylate, acrylic acid, and methacrylic acid.

The photosetting composition of the present invention contains 50 to 400 parts by weight of a second epoxy component (D) per 100 parts by weight of the first epoxy component (A). The second epoxy component (D) comprises at least one epoxy compound selected from the group consisting of (1) bisphenol type epoxy resins having a softening point of from 50° C. to 150° C., preferably, from 55° C. to 130° C., and (2) saturated carboxylic acid-modified epoxy compounds which have been prepared by the modification reaction of bisphenol type epoxy resins with saturated hydrocarbon carboxylic acids and which have a softening point of from 50° C. to 150° C., preferably, from 55° C. to 130° C. The above-mentioned bisphenol type epoxy resins and the saturated acid-modified epoxy compounds have no photopolymerizable or thermosettable unsaturated group and, therefore, no photosetting activity.

The bisphenol type epoxy resins may be reaction products of bisphenol compounds, for example, 2,2- bis(4'-hydroxyphenyl)propane or bis(4'-hydroxyphenyl)methane, with epichlorohydrin and, preferably have a molecular weight of 500 to 3000, more preferably, from 600 to 2500, and an epoxy equivalent of from 300 to 2000, more preferably, 350 to 1800. Also, it is preferable that the bisphenol type epoxy resins are in the form of a solid at room temperature.

The bisphenol type epoxy resins usable for the preparation of the saturated carboxylic acid-modified epoxy compound can be selected from the reaction products of bisphenol compounds, as mentioned above, with epichlorohydrin, the reaction products preferably having a softening point of from 70° C. to 170° C.

The saturated hydrocarbon carboxylic acids may be selected from the group consisting of formic acid, acetic acid, propionic acid, stearic acid, and caproic acid, preferably from lower aliphatic carboxylic acids having 1 to 6 carbon atoms.

It is necessary that the bisphenol type epoxy resins and the saturated carboxylic acid-modified expoxy compounds have a softening point of from 50° C. to 150° C. When the softening point is less than 50° C., the photoset film or articles produced from the resultant photosetting composition exhibits unsatisfactory impact bending strength. Also, when the softening point is more than 150° C., the resultant second epoxy component (D) exhibits unsatisfactory compatibility with the other components, and, therefore, the resultant photosetting composition exhibits unsatisfactory evenness.

The amount of the second epoxy component (D) is limited to the range of from 50 to 400 parts by weight per 100 parts by weight of the first epoxy component (A). When the amount of the component (D) is more than 400 parts by weight, the resultant photosetting composition exhibit an excessively large viscosity, and, therefore, is difficult to be handled. Also, the resultant photoset film or article exhibits poor impact strength and impact bending strength. Also, when the amount of the component (D) is less than 50 parts by weight, the resultant photocured film or article exhibits poor impact bending strength.

The photosetting composition of the present invention contains 0.5% to 15%, based on the entire weight of the photosetting composition, of a photopolymerization initiator (E). The initiator (E) may comprise at least one member selected from conventional photopolymerization initiators, for example, benzoin, benzoin methylether, benzoin ethylether, benzoin isopropylether, benzoin butylether, α-methyl benzoin, α-chloroxybenzoin, benzophenone, dimethoxyphenylacetophenone, benzyl, thioxanthone, chlorothioxanthone, methylthioxanthone, anthranilic acid, and dimethylaminobenzoate.

When the amount of the initiator is less than 0.5%, the resultant composition exhibits an unsatisfactory photocuring reaction rate. Also, an amount of the initiator more than 15% is not effective for increasing the photocuring reaction rate.

An inhibitor to thermopolymerization may be added to the photosetting composition of the present invention, in an amount of 5% or less, preferably, 3% or less, based on the entire weight of the photosetting composition. The inhibitor may comprise at least one member selected from conventional inhibitors, for example, hydroquinone, 2,6-di-tert-butyl-p-cresol, and p-benzoquinone.

The rotation viscosity of the photosetting composition can be reduced by controlling the content of the photopolymerizable monomeric component (C). Also, the rotation viscosity can be reduced by mixing a small amount of an organic solvent, for example, benzene, toluene, xylene, cumene, n-hexane, cyclohexane, ethyl acetate, or methyl-isobutyl ketone. Also, the phtosetting composition of the present invention may be added with a desired amount of wax, for example, an ester of a sorbitan compound with a higher aliphatic carboxylic acid or an ester of a glycerin compound with a higher aliphatic carboxylic acid; a liquid polymer, for example, a liquid polybutadiene, a liquid polypropylene, or a liquid polyethylene; a thermosetting resin, for example, a melamine-formaldehyde resin or an urea-formaldehyde resin; an inorganic pigment, for example, iron oxide, zinc oxide or titanium dioxide; and/or in organic pigment, for example, azo type, triphenylmethane type, quinoline type, anthraquinone type or phthalocyanine type pigment. When the above-mentioned thermosetting resin is added to the photosetting composition of the present invention, it is preferable that the thermosetting resin be soluble in an organic solvent. For example, it is preferable that an organic solvent-soluble urea-formaldehyde resin be added in an amount of 250 parts by weight or less, more preferably, from 5 to 220 part by weight, per 100 parts by weight of the first epoxy component (A), to the photosetting composition of the present invention.

The photosetting composition of the present invention is useful as various types of inks, paints, lacquers, and varnishes (clean varnish and white coating varnish) for printing, covering, or coating surfaces of metal or synthetic plastic sheets or other articles. The photosetting composition of the present invention exhibits a proper photocuring reaction rate and excellent bonding strength to the above-mentioned sheets or other articles, for example, aluminium sheets, tin-plated steel sheets, steel sheets, or synthetic plastic-coated metal sheets. Also, when the photosetting composition is photocured, the resultant resinous film or other article is transparent and exhibits excellent impact strength and impact bending strength.

The features and advantages of the present invention will be illustrated by the following referential examples of the preparations of component materials to be contained in the photosetting composition of the present invention; examples of the photosetting compositions of present invention, and comparative examples of comparative photosetting compositions.

In the examples and comparative examples, the photocuring reaction rate of the photosetting composition was determined by the following method. A photosetting composition was applied onto a surface of a degreased aluminum plate so as to form a coating film of the photosetting composition having a thickness of 10 microns. The aluminum plate coated with the photosetting composition was placed on a conveyor belt which rotated through a horizontal path located 9 cm below a 2 KW high voltage mercury lamp 25 cm long and made by Iwasaki Denki, K.K., Japan, at a predetermined velocity. The photosetting composition coating film was exposed to the ultraviolet rays from the mercury lamp and photocured. The velocity of the conveyor belt was varied to several levels. After the completion of the photocuring operation, a finger was pressed onto the surface of the photocured coating film and, then, removed therefrom. The surface of the pressed coating film was observed. The photocuring rate of the photosetting composition was expressed by the largest value of the velocity (m/min) of the conveyor belt at which no change in gloss of the surface of the coating film was observed.

In the examples and comparative examples, the specimens used in various physical property tests were prepared as follows.

A photosetting composition to be tested was uniformly applied onto a surface of an aluminum sheet having a thickness of 0.4 mm or a tin-free steel sheet (TFS) having a thickness of 0.22 mm, to form a uniform coating film of the photosetting composition having a weight of 70 mg/dm$^2$. The coated sheet was placed on the above-mentioned conveyer belt of the mercury lamp. The conveyer belt was rotated at a speed of 26 m/min while exposing the coated sheet to the ultraviolet rays from the mercury lamp, to photocure the coating film of the composition.

The photocured film was optionally heat-treated at a temperature of 210° C. for 10 minutes.

The adhering intensity of the coating film which was photocured and, then, heat-treated, was determined by a cross-hatch adhesion method as follows. A photocured film coated onto a metal plate was prepared by the same method as that described above. The coating film was scratched in a checkerboard pattern at intervals of 2 mm so as to form 100 squares separate from each other. An adhesive tape was adhered to the scratched coating films, and then peeled off therefrom. The adhering intensity of the photocured coating film was expressed by the number of the squares remaining on the metal sheet.

The pencil hardness of the photocured coating film was determined in accordance with the method described in paragraph 6.14, of JIS (Japan Industrial Standard) K 5,400.

The impact strength of the photocured coating film was determined in accordance with the method described in paragraph 6.13 of JIS K 5,400.

The impact bending strength of the photocured coating film was determined as follows: After the photocured coating film on the metal sheet was heat-treated in the afore-mentioned manner, the coated metal sheet was bent at an angle of about 120 degrees so that the photocured coating film came to the outside of the bent coated metal sheet. A predetermined number of the same metal sheets as the coated metal sheet were inserted into the inside of the bent coated metal sheet to provide a test piece. A 3 kg weight placed 50 cm above the test piece was dropped down onto the test piece so as to additionally bend the test piece at an angle of 180 degrees. In order to determine whether or not cracks were formed in the photocured coating film on the bent metal sheet, the bent test piece was immersed in an electroconductive liquid and a voltage was applied between the metal sheet and an electrode placed in the electroconductive liquid. Formation of crack in the coating film would cause an electric current to flow between the metal sheet and the electrode through the coating film layer.

The impact bending strength of the photocured coating film was represented by the smallest number of the metal sheets inserted into the inside of the bent test piece when no electric current was detected. That is, the higher the impact bending strength of the photocured coating film, the smaller the number of the inserted metal sheets.

REFERENTIAL EXAMPLE 1

[Preparation of partial esterification product of polycarboxylic acid with hydroxyl radical-containing acrylate compound]

A total of 1.5 moles of 2-hydroxyethylacrylate, which will be represented by 2-HEA hereinafter, were reacted with 1 mole of phthalic anhydride in the presence of 0.3 parts by weight of 2,6-tert-butyl p-cresol per 100 parts by weight of the phthalic anhydride, at a temperature of 95° C. for 8 hours. The resultant reaction mixture liquid contained 82% by weight of a partial esterification product and 18% by weight of nonreacted 2-HEA.

REFERENTIAL EXAMPLES 2 THROUGH 6

[Preparation of unsaturated acid-modified epoxy compound]

In each of the Referential Examples 2 through 6, a bisphenol A type epoxy resin of the molecular weight and epoxy equivalent indicated in Table 1 and produced by the Shell Co., an acryloyl radical-containing unsaturated acid compound of the type indicated in Table 1, 2-HEA, and 2-hydroxypropylacrylate, which will be represented by 2-HPA hereinafter, were mixed in the proportion by weight indicated in Table 1. The mixture was further mixed with 0.5%, based on the weight of the mixture, of a catalyst consisting of p-dimethylaminobenzoic acid. The mixture was subjected to a reaction at the temperature and for the time indicated in Table 1. The composition and acid value of the resultant reaction products are indicated in Table 1.

In Table 1, the partial ester of phthalic acid was a product of Referential Example 1 and the ester of 2-HEA with phosphoric acid was a commercial product of the trademark KAYAMA-PA-2, produced by Nippon Kayaku K. K.

Also, in Table 1, the degree of esterification of the epoxy resin with the unsaturated acid compound is represented by a ratio (%) of the number of the esterified epoxy rings in the reaction product to the entire number of the epoxy rings in the original epoxy resin.

TABLE 1

| | Composition of reaction mixture | | | | | | | | |
|---|---|---|---|---|---|---|---|---|---|
| | Bisphenyl type epoxy resin | | | Unsaturated acid compound | | Amount of 2-HEA | Amount of 2-HPA | Reaction condition | |
| Reference example No. | Molecular weight | Epoxy equivalent | Amount (part by wt.) | Type | Amount (part by wt.) | (part by wt.) | (part by wt.) | Temperature (°C.) | Time (hr) |
| 2 | 380 | 190 | 70 | Partial ester of phthalic acid | 73 | 16 | 0 | 90 | 6 |
| 3 | 900 | 470 | 90 | | 35 | 8 | 40 | " | 15 |
| 4 | 1400 | 925 | 100 | Ester of | 15 | 3 | 50 | " | 15 |

TABLE 1-continued

| | | | | | | | | | |
|---|---|---|---|---|---|---|---|---|---|
| 5 | 900 | 470 | 38 | 2-HEA with phosphoric acid | 14.6 | 0 | 53 | 70 | 11 |
| 6 | 900 | 470 | 100 | Acrylic acid | 10.6 | 0 | 28 | 90 | 16 |

| | Composition of reaction product mixture | | | | |
|---|---|---|---|---|---|
| | Unsaturated acid-modified epoxy compound | | Amount of 2-HEA (part by wt.) | Amount of 2-HPA (part by wt.) | Amount of non-reacted acid compound (part by wt.) |
| Reference example No. | Degree of esterification (%) | Amount (part by wt.) | | | | Acid value of reaction mixture |
| 2 | 72 | 140 | 16 | 0 | 3 | 4.5 |
| 3 | 64 | 121 | 8 | 40 | 4 | 3.8 |
| 4 | 45 | 111 | 3 | 50 | 4 | 5.5 |
| 5 | 57 | 50 | 0 | 53 | 2.6 | 18.2 |
| 6 | 68 | 110 | 0 | 28 | 0.6 | 2.0 |

REFERENTIAL EXAMPLE 7

[Preparation of unsaturated acid-modified epoxy compound]

A total of 27.2 parts by weight of the reaction product which was prepared in the same manner as that described in Referential Example 5 and which contained 12.8 parts by weight of an unsaturated acid-modified epoxy compound, 13.7 parts by weight of 2-HPA, and 0.7 parts by weight of a 2-HEA-phosphoric acid ester, were added with 2 parts by weight of propylene oxide. The mixture was stirred at a temperature of 60° C. for 30 minutes. The reaction product was exposed to a reduced pressure of 50 mmHg at a temperature of 60° C. to evaporate the nonreacted propylene oxide therefrom. The remaining reaction product contained an unsaturated acid-modified epoxy compound and had an acid value of 4.0.

REFERENTIAL EXAMPLE 8

[Preparation of saturated acid-modified epoxy compound]

The same procedures as those used in Referential Example 6 were carried out, except that acrylic acid was replaced by acetic acid, to prepare a saturated acid-modified epoxy compound. The reaction product liquid contained 108.6 parts by weight of the saturated acid-modified epoxy compound having a degree of esterification of 69%, 28 parts by weight of 2-HPA, and 0.2 parts by weight of acetic acid.

REFERENTIAL EXAMPLE 9

[Preparation of saturated acid-modified epoxy compound]

The same procedures as those mentioned in Referential Example 4 were carried out, except that formic acid was used in place of the partial ester of phthalic acid.

The resultant reaction product liquid contained 104 parts by weight of a saturated acid-modified epoxy compound having a degree of esterification of 65%, 50 parts by weight of 2-HPA, and 0.2 parts by weight of formic acid.

REFERENTIAL EXAMPLE 10

[Preparation of oligoesterdiacrylate mixture]

A four-neck flask with a stirrer, a thermometer, an inlet for introducing nitrogen gas, and a reflux cooling pipe having water separator was charged with one mole of phthalic anhydride and 2.5 moles of 1,5-pentane diol and then with 50 millimoles of p-toluene sulfonic acid and 200 ml of toluene. The inside of the flask was then filled with nitrogen gas. The resultant reaction mixture was stirred in the nitrogen gas atmosphere while heated and refluxed. The temperature of the mixture was maintained at the level of from 110° C. to 120° C. During the reaction procedure, the acid value of the reaction mixture was measured. The reaction procedure was stopped when it was found that no water was generated from the reaction mixture and the acid value of the reaction mixture became constant. The resultant reaction product mixture contained an oligoester mixture.

The reaction product mixture was cooled to room temperature and then placed in a separating funnel. The reaction product mixture in the separating funnel was washed three times by using about 500 ml of water in each washing procedure to remove the nonreacted 1,5-bentane diol.

The washed reaction product mixture was evaporated under reduced pressure by using an evaporator to remove the solvent and by-products of low boiling temperatures. The residue in the evaporator comprised the oligoester mixture.

The same type of four-neck flask as that described above was charged with one mole of the oligoester mixture and 2.0 moles of acrylic acid and then with 50 millimoles of p-toluene sulfonic acid, 9 mg of a polymerization inhibitor, and a solvent consisting of 300 ml of toluene and 300 ml of benzene. The resultant reaction mixture was heated at a temperature of about 95° C. to 100° C. for 15 hours while refluxed and while blowing air into the flask to prevent the production of undesirable by-product polymers. The oligoester mixture was converted to a mixture of origoesterdiacrylate compounds of the formula (I).

During the reaction procedure, the acid value of the reaction mixture was measured. The reaction procedure was terminated when it was found that no water was generated from the reaction mixture and the acid value became constant.

The reaction product mixture was washed and then evaporated under reduced pressure in the same manner as that mentioned above. The mixture of oligoesterdiacrylates of the formula (I) was recovered, in which formula, l=5 and n=1 to 10. That is, the mixture contained 37.3% by weight of an oligoesterdiacrylate compounds in which n=1, 30.3% by weight of another compound in which n=2, 17.0% by weight of another compound in which n=3, 8.5% by weight of another compound in which n=4, 3.8% by weight of another compound in which n=5, 1.5% by weight of another compound in which n=6, and 1.1% by weight of a mixture of other compounds in which n=7 to 10. Also, the oligoesterdiacrylate mixture exhibited a rotation viscosity of 480 centipoises at a temperature of 25° C.

EXAMPLE 1 THROUGH 11

In each of the Examples 1 through 11, the reaction product liquid produced in one of Referential Examples 2 through 7 and containing an unsaturated acid-modified epoxy compound; 2-HPA, phenoxyethylacrylate, which will be represented by PEA hereinafter; the oligoesteracrylate mixture produced in Referential Example 10; the ester of 2-HEA with phosphoric acid (KAYAMA PA-2); xylene; and a bisphenol A type epoxy resin or its modification indicated in Table 2 were mixed in the proportions indicated in Table 2. The mixture was then further mixed with 5%, based on the weight of the mixture, of a photopolymerization initiator consisting of benzoin ethylether and 0.5%, based on the weight of the mixture, of an additive consisting of sorbitan monostearate. A photosetting composition was obtained.

The rotation viscosity at the temperature of 25° C., the photocuring reaction rate of the photosetting composition, and various physical properties (pencil hardness, bonding strength, impact strength, impact bending strength) of the photocured film prepared from the photosetting composition were measured. The results of the measurements are indicated in Table 3.

COMPARATIVE EXAMPLE 1

The same procedures as those described in Example 3 were carried out, except that no bisphenol A type epoxy resin was used. The results of the measurements are indicated in Table 3.

TABLE 2

| Example No. | | Unsaturated acid-modified epoxy compound | | Oligo-ester acrylate mixture Amount (part by wt.) | Photopolymerizable monomeric compound | | | | |
|---|---|---|---|---|---|---|---|---|---|
| | | No. of Referential Example in which compound was prepared | Amount of compound (part by wt.) | | 2-HEA (part by wt.) | 2-HPA (part by wt.) | PEA (part by wt.) | Partial ester of phthalic acid (part by wt.) | Ester of 2-HEA with phosphoric acid (part by wt.) |
| Example | 1 | 2 | 12.4 | 30 | 1.4 | 44 | 0 | 0.3 | 2 |
| | 2 | 3 | 9.6 | 13 | 0.6 | 17.3 | 0 | 0.3 | 0.9 |
| | 3 | 4 | 10.0 | 15 | 0.3 | 20 | 0 | 0.3 | 1 |
| | 4 | 5 | 10.0 | 10 | 0 | 10 | 10 | 0 | 0.5 |
| | 5 | 6 | 10.0 | 10 | 0 | 10 | 10 | 0 | 0.5 |
| | 6 | 7 | 12.0 | 10 | 0 | 14.5 | 14.5 | 0 | 0 |
| | 7 | 3 | 9.6 | 13 | 0.6 | 17.3 | 0 | 0.3 | 0.9 |
| | 8 | 4 | 7.1 | 10 | 0.2 | 20 | 20 | 0.3 | 0 |
| | 9 | 4 | 4.3 | 10 | 0.2 | 20 | 20 | 0.3 | 0 |
| | 10 | 4 | 3.4 | 10 | 0.1 | 20 | 20 | 0.3 | 0 |
| | 11 | 3 | 9.6 | 13 | 0.6 | 17.3 | 0 | 0.3 | 0.9 |
| | 12 | 4 | 10.0 | 15 | 0.3 | 20 | 0 | 0.3 | 0 |
| Comparative Example | 1 | 4 | 10.0 | 10 | 0.3 | 20 | 0 | 0.3 | 1 |

| Example No. | | Solvent Xylene (part by wt.) | Epoxy resin or saturated acid-modified epoxy compound | | | |
|---|---|---|---|---|---|---|
| | | | Softening point (°C.) | Molecular weight | Epoxy equivalent | Amount (part by wt.) |
| Example | 1 | 10 | 94–104 | 1400 | 925 | 20 |
| | 2 | 2.5 | " | " | " | 9 |
| | 3 | 5.6 | 64–74 | 900 | 470 | 10 |
| | 4 | 2.5 | 94–104 | 1400 | 925 | 10 |
| | 5 | 2.5 | " | " | " | 10 |
| | 6 | 2.8 | " | " | " | 6 |
| | 7 | 2.5 | 64–74 | 900 | 470 | 9 |
| | 8 | 3.2 | 94–104 | 1400 | 925 | 7.5 |
| | 9 | 3.2 | " | " | " | 10.5 |
| | 10 | 3.2 | " | " | " | 11.5 |
| | 11 | 2.5 | 60–70 | (*)1 | | 9 |
| | 12 | 0 | 90–100 | (*)2 | | 10 |
| Comparative Example | 1 | 4.5 | — | — | — | 0 |

Note:
(*)1 - The saturated acid-modified epoxy compound prepared in Referential Example 8 was used.
(*)2 - The saturated acid-modified epoxy compound prepared in Referential Example 9 was used.

TABLE 3

| Example No. | | Property of photosetting composition | | Property of photocured film | | | | | | |
|---|---|---|---|---|---|---|---|---|---|---|
| | | Rotation viscosity at 25° C. (cP) | Photocuring reaction rate represented by belt speed (m/min) | Pencil Hardness | | Bonding property to | | Dupont impact strength (⅛ inch) × 500 g) | Impact bending strength on | |
| | | | | Before heat treatment | After heat treatment | Al sheet | TFS sheet | | Al sheet | TFS sheet |
| Example | 1 | 540 | 20 or more | 2H | 5H | 100 | 100 | 150 cm or more | 7 | 6 |
| | 2 | 1000 | " | " | " | " | " | " | 6 | 6 |
| | 3 | 1600 | " | 3H | " | " | " | " | 6 | 5 |
| | 4 | 4000 | " | H | " | " | " | " | 5 | 3 |
| | 5 | 4850 | " | " | " | " | " | " | 4 | 3 |
| | 6 | 530 | " | " | " | " | " | " | 5 | 3 |
| | 7 | 650 | " | 2H | " | " | " | " | 6 | 6 |
| | 8 | 210 | " | " | 4H | " | " | " | 3 | 3 |
| | 9 | 220 | " | " | " | " | " | " | 4 | 3 |
| | 10 | 230 | " | " | " | " | " | " | 5 | 4 |
| | 11 | 1240 | " | " | 5H | " | " | " | 6 | 6 |
| | 12 | 4600 | " | " | " | " | " | "5 | 4 | |
| Comparative Example | 1 | 450 | " | 3H | " | " | " | " | 8 | 7 |

EXAMPLES 13 THROUGH 16

In each of the Examples 13 through 16, the reaction product liquid prepared in Referential Example 6 and containing an unsaturated acid-modified epoxy compound; 2-HPA; PEA; the oligoesteracrylate mixture prepared in Referential Example 10; xylene; a bisphenol A type epoxy resin having a softening point of 94° C. to 104° C., an average molecular weight of 1400, and an epoxy equivalent of 925; and a urea-formaldehyde resin which was prepared by removing a solvent from a solvent-dissolved urea-formaldehyde resin which was available in the trademark Uban 10S-60, from Mitsui Toatsu Kagaku K.K., were mixed altogether in the proportions indicated in Table 4. The mixture was then further mixed with 5%, based on the weight of the mixture, of a photopolymerization initiator consisting of benzoin methylether and 0.5%, based on the weight of the mixture, of an additive consisting of sorbitan monostearate. A photosetting composition was obtained.

The results of the measurements are indicated in Table 5.

We claim:

1. A photosetting composition comprising:

A. 100 parts by weight of a first epoxy component comprising at least one unsaturated acid-modified epoxy compound which has been prepared by the modification reaction of a bisphenol type epoxy resin with an unsaturated acid compound having at least one acryloyl radical;

B. 30 to 400 parts by weight of an oligoester component comprising at least one oligoester diacrylate compound which has been prepared by the reaction of acrylic acid with an oligoester of an aromatic polycarboxylic acid with an organic dihydroxyl compound and which has a molecular weight of 420 or more and is in the form of a liquid at room temperature;

C. 50 to 1200 parts by weight of a photopolymerizable monomeric component comprising at least one photopolymerizable acrylate type monomeric compound having a molecular weight of 100 to 400 and being in the form of a liquid at room temperature;

TABLE 4

| Example No. | Composition (part by weight) | | | | | | |
|---|---|---|---|---|---|---|---|
| | Unsaturated acid-modified epoxy compound | Oligoester acrylate mixture | Photopolymerizable monomeric compound | | Xylene | Bisphenol A type epoxy resin | Urea-formaldehyde resin |
| | | | 2-HPA | PEA | | | |
| 13 | 7.0 | 10.00 | 20.0 | 20.0 | 3.4 | 7.0 | 5.0 |
| 14 | " | " | " | " | 3.6 | " | 8.0 |
| 15 | " | " | " | " | 3.8 | " | 11.0 |
| 16 | " | " | " | " | 4.0 | " | 14.0 |

TABLE 5

| Example No. | Photosetting composition | | Photocured film | | | | | | |
|---|---|---|---|---|---|---|---|---|---|
| | Rotation viscosity at 25° C. (cP) | Photocuring reaction rate (belt speed) (m/min) | Pencil hardness on Al sheet | | Bonding property to | | Dupont impact strength (⅛ inch × 500 g) | Impact bending strength | |
| | | | Before heat-treatment | After heat-treatment | Al sheet | TFS sheet | | Al sheet | TFS sheet |
| 13 | 195 | 20 or more | 2H | 5H | 100 | 100 | 150 cm or more | 4 | 3 |
| 14 | 260 | " | " | " | " | " | " | 4 | 3 |
| 15 | 320 | " | " | " | " | " | " | 5 | 3 |
| 16 | 450 | " | " | " | " | " | " | 6 | 5 |

D. 5 to 400 parts by weight of a second epoxy component comprising at least one epoxy compound selected from the group consisting of (1) bisphenol type epoxy resins having a softening point of from 50° C. to 150° C. and (2) saturated carboxylic acid-modified epoxy compounds which have been prepared by the modification reaction of bisphenol type epoxy resins with saturated hydrocarbon carboxylic acids and which have a softening point of 50° C. to 150° C., and;

E. a photopolymerization initiator in an amount of 0.5% to 15% based on the entire weight of said photosetting composition.

2. A photosetting composition as claimed in claim 1, wherein said unsaturated acid-modified epoxy compound, the degree of esterification of the epoxy rings in said bisphenol type epoxy resin molecules with said unsaturated acid compound is 30% to 80% based on the entire number of said epoxy rings.

3. A photosetting composition as claimed in claim 1, wherein said bisphenol type epoxy resin in said first epoxy component (A), has a molecular weight of from 380 to 2000, and an epoxy equivalent of from 180 to 2000.

4. A photosetting composition as claimed in claim 1, wherein said bisphenol type epoxy resin in said first epoxy component (A), is selected from the reaction products of bisphenol compounds with epichlorohydrin.

5. A photosetting composition as claimed in claim 1, wherein said unsaturated acid compound is selected from the group consisting of acrylic acid, partial esterification products of organic polycarboxylic acids with acrylate compounds having at least one hydroxyl radical, and mono- and di-esterification products of acrylate compounds having at least one hydroxyl radical with phosphoric acid.

6. A photosetting composition as claimed in claim 5, wherein each molecule of said partial esterification products of said organic polycarboxylic acids with said acrylate compound is provided with at least one carboxylic radical and at least one acryloyl radical and has a molecular weight of 1000 or less.

7. A photosetting composition as claimed in claim 5, wherein said organic polycarboxylic acid is selected from the group consisting of o-, m-, and p-phthalic acids, trimellitic acid, pyromellitic acid, biphenyltetracarboxylic acids, benzophenone tetracarboxylic acids, citric acid, maleic acid, and anhydides of the above-mentioned acids.

8. A photosetting composition as claimed in claim 5, wherein said acrylate compound having at least one hydroxyl radical is selected from the group consisting of 2-hydroxyethylacrylate, 2-hydroxypropylacrylate, diethylene glycol monoacrylate, dipropylene glycol monoacrylate, and triethylene glycol monoacrylate.

9. A photosetting composition as claimed in claim 1, wherein said reaction product of acrylic acid with said oligoester comprises, as a main component, a compound selected from those of the formulae (I) and (II):

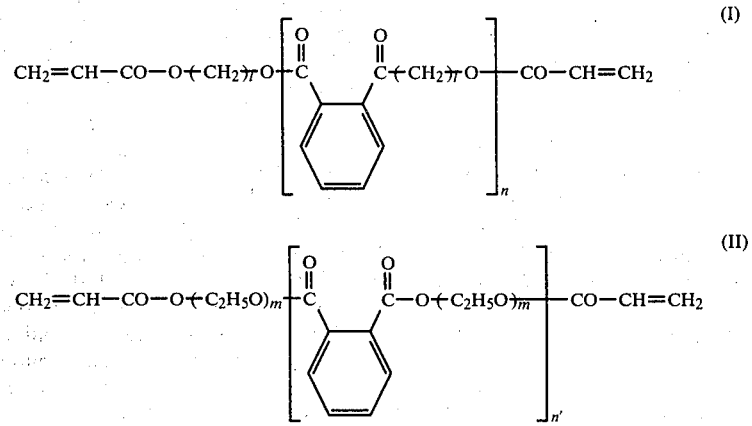

wherein l represents an integer of 4 to 8, m represents an integer of 2 to 5, and n and n' represent an integer of 1 to 10.

10. A photosetting composition as claimed in claim 1, wherein said aromatic polycarboxylic acid is selected from aromatic dicarboxylic acids.

11. A photosetting composition as claimed in claim 1, wherein said oligoester is a reaction product of an aromatic polycarboxylic acid selected from the group consisting of o-, m-, and p-phthalic acids, phthalic anhydride, trimellitic acid, trimellitic anhydride and 4,4'-biphenyl dicarboxylic acid with a dihydroxy compound selected from the group consisting of dihydroxy alkyl compounds and polyalkylene glycol compounds.

12. A photosetting composition as claimed in claim 11, wherein said dihydroxyalkyl compound is selected from the group consisting of n-butane diol, n-pentane diol, n-hexane diol, n-heptane diol, and n-octane diol.

13. A photosetting composition as claimed in claim 11, wherein said polyalkylene glycol compound is selected from the compounds of the formula:

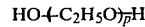

wherein p represents an integer of 2 to 5.

14. A photosetting composition as claimed in claim 1, wherein said oligoester diacrylate compound exhibits a rotation viscosity of 200 to 50,000 c poise.

15. A photosetting composition as claimed in claim 1, wherein said photopolymerizable acrylate type monomeric compound is selected from the group consisting of hydroxyalkylacrylate compounds; glycoldiacrylate compounds; ester compounds of polyhydric alcohol compounds with acrylic acid; ester compounds of polycarboxylic acids with hydroxyalkylacrylates; ester compounds of phosphoric acid with hydroxyalkylacrylates; and phenol type acrylate compounds.

16. A photosetting composition as claimed in claim 15, wherein said hydroxyalkylacrylate compound is selected from the group consisting of 2-hydroxyethylacrylate, 2-hydroxypropylacrylate, diethyleneglycol monoacrylate, dipropyleneglycol monoacrylate, and triethyleneglycol monoacrylate.

17. A photosetting composition as claimed in claim 15, wherein said glycoldiacrylate compound is selected from the group consisting of ethyleneglycol diacrylate, propyleneglycol diacrylate, diethyleneglycol diacrylate, dipropyleneglycol diacrylate, and triethyleneglycol diacrylate.

18. A photosetting composition as claimed in claim 15, wherein said ester compound of a polyhydric alcohol compound with acrylic acid is selected from the group consisting of pentaerithritol triacrylate, pentaerithritol diacrylate, glycerine monoacrylate, and glycerine diacrylate.

19. A photosetting composition as claimed in claim 15, wherein in said ester compound of a polycarboxylic acid with a hydroxyalkylacrylate, said polycarboxylic acid is selected from the group consisting of o-, m-, and p-phthalic acids, trimellitic acid, pyromellitic acid, biphenyl tetracarboxylic acids, benzophenone tetracarboxylic acids, citric acids, and maleic acids, and said hydroxyalkylacrylate is selected from the group consisting of 2-hydroxyethylacrylate and 2-hydroxypropylacrylate.

20. A photosetting composition as claimed in claim 15, wherein in said ester compound of phosphoric acid with hydroxyalkylacrylate, said hydroxyalkylacrylate is selected from the group consisting of 2-hydroxyethylacrylate and 2-hydroxypropylacrylate.

21. A photosetting composition as claimed in claim 15, wherein said phenol type acrylate compound is selected from the group consisting of phenoxyethylacrylate, phenoxymethylacrylate, 2-phenoxy-1-methylethylacrylate, 3-phenoxy-2-hydroxy-propylacrylate.

22. A photosetting composition as claimed in claim 1, wherein said photopolymerizable monomeric compound contains at least one additional photopolymerizable monomeric compound selected from the group consisting of hydroxyalkylmethacrylate, ester compounds of polycarboxylic acids with hydroxyalkylmethacrylates, ester compounds of phosphoric acid with hydroxyalkylmethacrylate, glycol dimethacrylate, styrene, vinyl toluene, vinyl acetate, methylmethacrylate, acrylic acid, and methacrylic acid.

23. A photosetting composition as claimed in claim 1, wherein said bisphenol type epoxy resins in said second epoxy component (D) are reaction products of bisphenol compounds with epichlorohydrin.

24. A photosetting composition as claimed in claim 23, wherein said bisphenol type epoxy resins have a molecular weight of 500 to 3000 and an epoxy equivalent of 300 to 2000.

25. A photosetting composition as claimed in claim 1, wherein said epoxy-modified saturated polymeric compound is selected from the reaction products of bisphenol type epoxy resins having a softening point of 70° C. to 170° C., with saturated hydrocarbon carboxylic acids selected from the group consisting of formic acid, acetic acid, propionic acid, stearic acid, and caproic acid.

26. A photosetting composition as claimed in claim 1, wherein said photopolymerization initiator comprises at least one member selected from the group consisting of benzoin, benzoin methylether, benzoin ethylether, benzoin isopropylether, benzoin butylether, α-methyl benzoin, α-chloroxybenzoin, benzophenone, dimethoxyphenylacetophenone, benzyl, thioxanthone, chlorothioxanthone, methylthioxanthone, anthranilic acid, and dimethylaminobenzoate.

* * * * *